United States Patent [19]

Mead et al.

[11] Patent Number: 4,716,312
[45] Date of Patent: Dec. 29, 1987

[54] CMOS LOGIC CIRCUIT

[75] Inventors: Carver A. Mead; John C. Wawrzynek, both of Pasadena, Calif.

[73] Assignee: California Institute of Technology, Pasadena, Calif.

[21] Appl. No.: 47,492

[22] Filed: Apr. 27, 1987

Related U.S. Application Data

[63] Continuation of Ser. No. 731,849, May 7, 1985, abandoned.

[51] Int. Cl.[4] .................. H03K 19/096; H03K 17/284; H03K 17/693
[52] U.S. Cl. .................................... 307/475; 307/452; 307/453; 307/579; 307/279; 377/79
[58] Field of Search ............... 307/443, 475, 451, 452, 307/453, 576, 579, 583, 585, 264, 279, 291; 377/79, 117

[56] References Cited

U.S. PATENT DOCUMENTS

| | | | |
|---|---|---|---|
| 3,431,433 | 3/1969 | Ball et al. | 377/79 |
| 3,676,717 | 7/1972 | Lockwood | 307/279 |
| 4,007,358 | 2/1977 | Iguchi et al. | 328/104 |
| 4,132,904 | 1/1979 | Harari | 307/279 |
| 4,355,244 | 10/1982 | Gonin | 377/117 |
| 4,496,857 | 1/1985 | Chao | 307/279 |
| 4,511,810 | 4/1985 | Yukawa | 307/279 |

Primary Examiner—Stanley D. Miller
Assistant Examiner—Timothy P. Callahan
Attorney, Agent, or Firm—Freilich, Hornbaker, Rosen & Fernandez

[57] ABSTRACT

A monodirectional logic form is provided using a bistable circuit of the set-rest type comprised of two cMOS inverters connected in parallel to a source of power ($V_{dd}$) by a power-down p-channel MOS transistor. Each of the cMOS inverters is comprised of a first p-channel MOS transistor in source-drain-drain-source series with an n-channel MOS transistor. Two signal-pass n-channel MOS transistors are provided, one a signal-pass transistor connected as a series switch in a first signal (d) line to the input terminal of one cMOS inverter and the output terminal of the other cMOS inverter, and the other a signal-pass transistor connected as a series switch in a second complement signal (d) line to the input terminal of the other cMOS inverter and the output terminal of the one cMOS inverter. The cMOS inverters are thus directly cross-coupled, input to output, and the input to each is gated by one of the pass transistors, while a first phase of a nonoverlapping two-phase clock signal source is applied to the gates of the power-down and signal-pass transistors. A set-reset circuit coupled in series, either directly or by switching functions is connected to receive the second phase clock signal. The signal pass transistors are connected to mutually exclusive switching functions (series-parallel nMOS network) that provide current paths to circuit ground in response to data signals, or circuit paths to the output terminals of another set-reset circuit.

7 Claims, 10 Drawing Figures

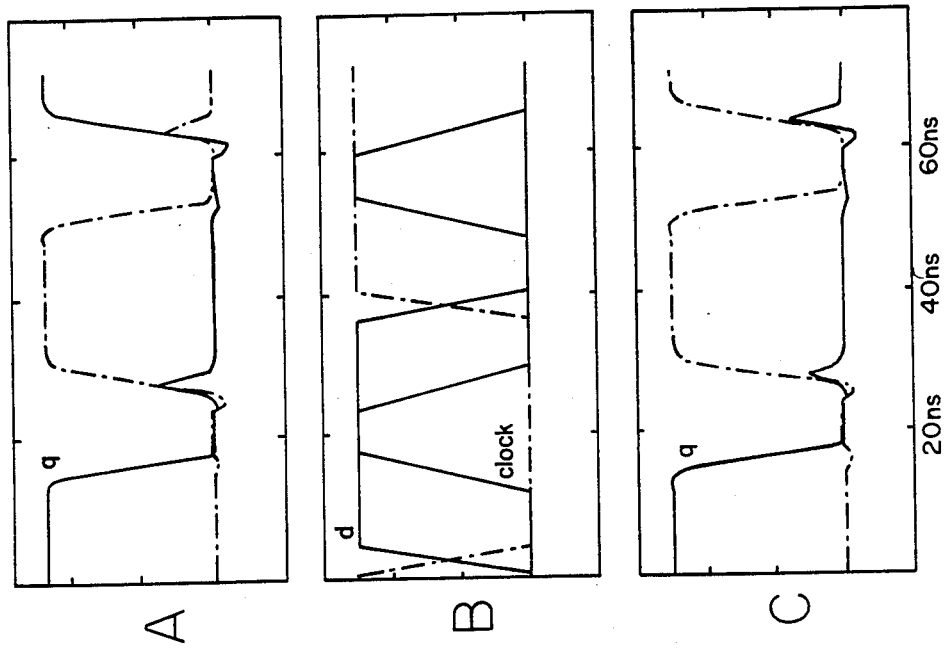
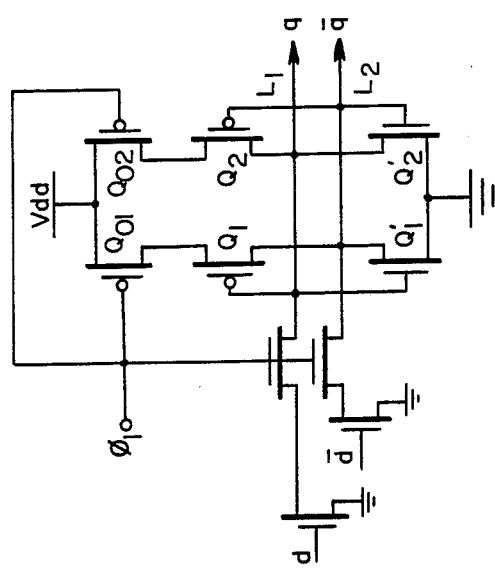
FIG. 2a
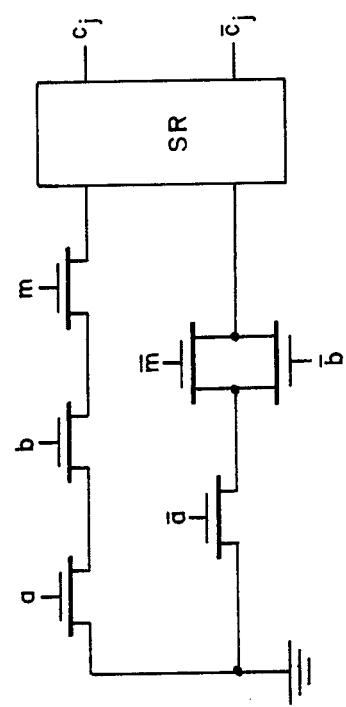
FIG. 2b
FIG. 2c

CMOS LOGIC CIRCUIT

This application is a continuation of application Ser. No. 731,849, filed May 7, 1985, which is now abandoned.

BACKGROUND OF THE INVENTION

This invention relates to logic circuits utilizing metal oxide semiconductor field-effect transistors, and more particularly to complementary set-reset logic circuits utilizing both pMOS and nMOS devices on the same chip in a complementary (cMOS) circuit.

A number of logic forms and clocking schemes for cMOS integrated circuits are in common use. The most common logic form consists of two networks of transistors, the gates of which are connected to the input variables. An n-channel network defines the Boolean condition under which the output is connected to ground (logic zero), and a p-channel network defines the complementary condition under which the output is connected to a logical one. Since in many cMOS processes the output of a single pass transistor cannot be guaranteed to exceed the logic threshold of a typical inverter, pass transistor networks are either forbidden or a complementary transmission gate employing both p and n-channel devices is used.

Clocking schemes for cMOS presently offer tradeoffs over a wide range in the risk vs efficiency space. In one scheme, a single phase clock and its complement are distributed, and used to control either transmission gates or transistors controlling power to the p and n-channel switching networks. Proper operation in either case requires that the logic delay of the stage exceed the skew between the two clock lines. In a much safer approach, a two-phase clock is used, both the clock and its complement being distributed for each phase. In this case risk is eliminated at the expense of doubling the clock wiring. Yet another form is popular in gate level designs. A single clock is distributed, and locally inverted at master-slave storage elements. Risk in this case is eliminated at the expense of a minimum storage element employing ten or more transistors.

OBJECTS AND SUMMARY OF THE INVENTION

An object of this invention is to provide a logic form that retains much of the simplicity, elegance, and compactness of a familiar 2-phase nMOS form, with the added advantage of fully static operation. Formal semantics for circuits implemented in this form are easily derived without detailed circuit or switch-level simulation.

A further object is to provide a logic form with monodirectionality, using a bistable circuit of the set-reset (SR) type, and switching function logic in its input path using 2-phase, 2-wire control with no race conditions. Such a logic form works well with clock signals having rise and fall times slower than the logic signals as often encountered in VLSI systems.

These and other objects and advantages of the present invention are realized with a set-reset circuit comprised of two cMOS inverters connected in parallel to a source of power ($V_{dd}$) by either a power-down transistor shared by both cMOS inverters or one power-down transistor for each cMOS inverter. The power-down transistor is of a type chosen from a group consisting of n-channel and p-channel, and each of the cMOS inverters is comprised of a first transistor of the same type as said power-down transistor in source-drain-drain-source series with a second transistor of the other type not chosen for the power-down transistor, and two signal-pass transistors of the type not chosen for the power-down transistor, one signal-pass transistor connected as a series switch in a first signal line to the input terminal of one cMOS inverter and the output terminal of the other cMOS inverter, and the other pass transistor connected as a series switch in a second signal line to the input terminal of the other cMOS inverter and the output terminal of the one cMOS inverter, whereby the cMOS inverters are directly cross-coupled, input to output, and the input to each is gated by one of the signal-pass transistors. One phase of a two-phase clock is applied to the gates of the power-down transistor and both signal-pass transistors, while the other phase is applied to the corresponding signal-pass transistors of another set-reset circuit putting data on the two lines and/or another circuit receiving data from the two lines. Between the source and destination set-reset circuits, there may be a switching function, but otherwise the data from a set-reset circuit is taken directly as complementary data bits from its two lines connected to the inputs and outputs of the cMOS inverters.

BRIEF DESCRIPTION OF THE DRAWINGS

FIG. 2a illustrates an alternate form of the present invention, FIG. 2b illustrates graphs of operation, and FIG. 2c illustrates series and series-parallel networks for switching functions.

DESCRIPTION OF PREFERRED EMBODIMENTS

Figure 1:
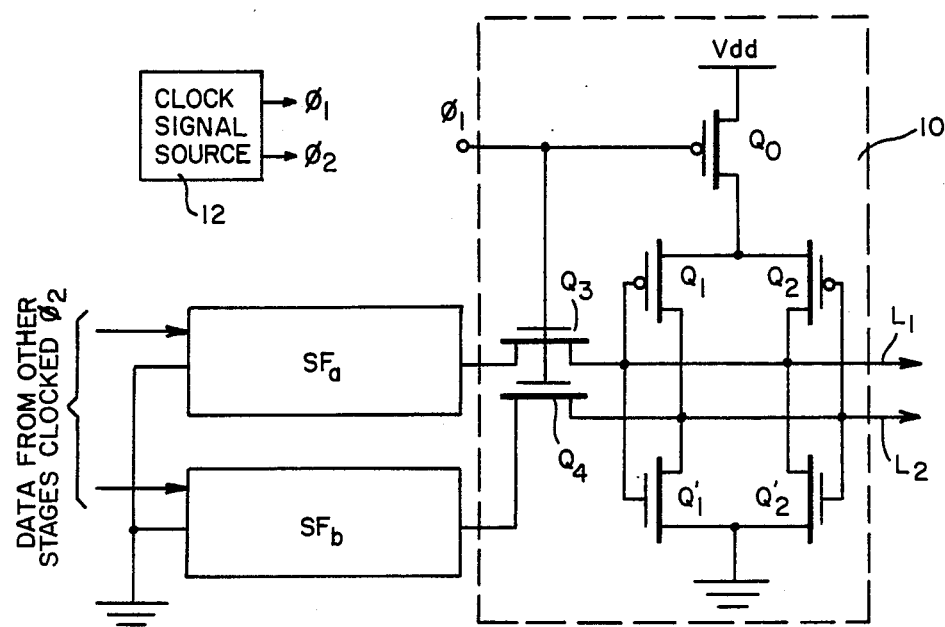
FIG. 1 illustrates a general form of the cMOS circuit that constitutes the present invention.

Referring to FIG. 1 a single stage of the general form of the present invention is a set-reset (SR) circuit 10 connected to switching functions $SF_a$ and $SF_b$, and to a clock signal of one phase $\phi_1$. The SR circuit is comprised of two cMOS inverters connected in parallel to a source of power $V_{dd}$ by a power-down transistor $Q_o$, each inverter having a pair of MOS transistors $Q_1$, $Q_1'$ and $Q_2$, $Q_2'$ and the output of each inverter being connected to both the input of the other inverter and to the output of the SR circuit with separate conductors (hereinafter called lines). Pass transistors $Q_3$ and $Q_4$ connect the inputs of the respective cMOS inverters $Q_1$, $Q_1'$ and $Q_2$, $Q_2'$ to a preceding SR stage, either directly or through switching functions $SF_a$ and $SF_b$. The signal-pass transistors $Q_3$ and $Q_4$ may be either n-type or p-type, but must be of the type opposite that of the power-down transistor $Q_o$ so that the power down transistor and the pass transistors will operate (conduct) alternately in response to a clock $Q_1$. As for the transistors $Q_1$ and $Q_2$, they also may be of either type, but must be of the type opposite that of the transistors $Q_1'$ and $Q_2'$.

FIG. 2a illustrates an alternative embodiment for the SR circuit in which two power-down transistors $Q_{01}$ and $Q_{02}$ are employed, one for each cMOS inverter. The gates of both are connected to the same clock signal.

FIG. 2a also illustrates the simplest form of a switching function consisting of an n-channel transistor connected in series to ground with a pass transistor. As noted in FIG. 1, the data is from a preceding stage clocked with the second of a two-phase nonoverlapping clock signal.

Operation is somewhat faster when separate power-down transistors are used for the two sides of the SR circuit. However, care should then be taken to match the power-down transistors as to their threshold voltage (Vth) characteristic. For example, perfect operation is achieved when both have Vth=0.76, but a data bit will fail to be entered when they have Vth equal to 0.72 and 0.78, a mismatch of only 0.06 volt. FIG. 2b illustrates in graph A the perfect operation resulting from a clock and data signals shown in graph B, and in graph C the failure to enter the data bit for the same clock and data signals shown in graph B due to variation in Vth for the two power-down transistors.

The switching functions $SF_a$ and $SF_b$ are more generally series-parallel networks of transistors of the same type as the pass transistors. For example, FIG. 2c illustrates a switching function $SF_a$ and $SF_b$ for an SR circuit useful in computing a carry from inputs a, b and m in a system for computing the product a+[bxm]. Data input signals connect to the gates of these transistors. These signals cannot come from within the networks themselves; they come from outputs of other stages similar to the one shown, but clocked on the opposite phase $\phi_2$ of the two-phase clock source 12.

In this and all other examples, n-well technology is assumed to illustrate the principals. The circuit can be fabricated in either p-well or n-well technology. However, in many processes it is desirable to use devices having (n-channel in an n-well or p-channel in a p-well such as, for the pass transistors, since such devices usually have lower body effect (changing of threshold characteristics with source voltage). However, in processes where the body effect is not too extreme, the extra performance of n-channel devices dictates that they be used for the pass transistors and the switching functions. In any case, the SR circuit for a p-well technology is identical to the one shown in FIG. 1 for n-well technology, provided the p- and n-channel devices are interchanged, with the power and signal voltages changes from positive to negative. With this convention, the same physical masks can be used to fabricate a VLSI in either of the technologies. Consequently, although the n-well technology is assumed and n-channel signal-pass transistors are illustrated for convenience, it is to be understood that the present invention may use either p-well or n-well technology, and use either p- channel or n-channel transistors for the switching functions.

Referring again to FIG. 1, each mutually exclusive switching function is formally defined as the Boolean logic condition on input variables under which there is an electrical path (through "on" transistors) connecting its two terminals. If either $SF_a$ or $SF_b$ is true, but not both, there will be a signal path from respective output lines $L_1$ and $L_2$ to ground. The signals to the pass transistors in both $SF_1$ and $SF_2$ must be stable before a clock pulse is applied, and must remain stable for the duration of the clock pulse. If the stage 10 is storing a logic one (upper line $L_1$ high) and $SF_1$ becomes true, the upper line will discharge to ground during the high period of the clock signal $\phi_1$. By the falling edge of the clock signal both lines $L_1$ and $L_2$ will be low. The proper operation of the stage depends upon a gradual falling edge on the clock signal. As the clock signal begins to fall, current flows through the power-down transistor $Q_o$ into both transistors $Q_1$ and $Q_2$. Both lines will begin to charge toward $V_{dd}$. The upper line $L_1$, however, has a path to ground through the $SF_1$ network because $SF_1$ is true. Some of the current into the upper line will be lost through this path, since the pass transistors $Q_3$ and $Q_4$ are still on. If the charge lost through this path is greater than any residual difference in voltage left over from the previously stored state, the lower line $L_2$ will rise faster than the upper line. Once the lower line has traversed the threshold of $Q_2'$, it will dominate and will hold the upper line $L_1$ at ground.

Figure 3:
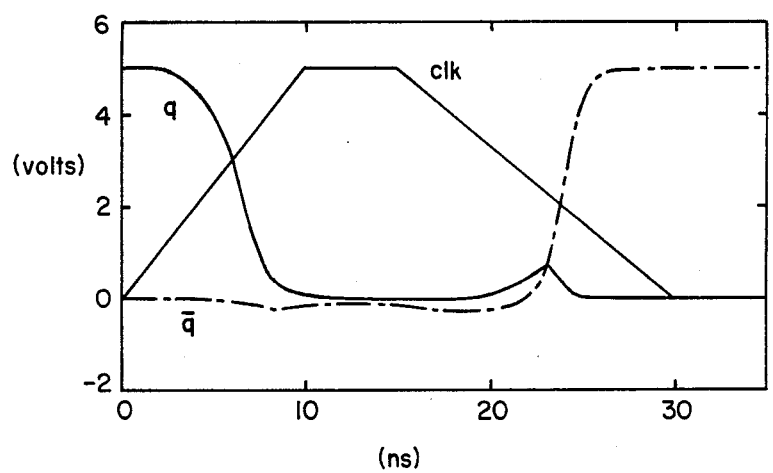
FIG. 3 is a timing diagram useful in understanding the operation of the circuit in FIG. 1.

The proper operation of the circuit of FIG. 1 is shown in FIG. 3. For this example, both switching functions $SF_a$ and $SF_b$ are assumed to consist of four n-channel transistors in series. In order to test such a circuit under worst-case conditions, all transistors but those closest to ground were turned on, and the nodes between charged to the previous state values. The transistor next to ground in $SF_a$ was then turned on and the clock period initiated. The residual charge keeps the bottom line $L_2$ below the top line $L_1$ throughout the clock rising edge and steady high period. As the clock begins to fall, the path to ground reduces the rate at which the top line can rise. The bottom line starts from behind but prevails. For longer clock fall times, the crossover occurs at lower voltages, and margins improve markedly.

There are four possible combinations of the two switching functions. The outcome $q^{n+1}$ when both are true is not defined. However, the outcome when both are false is reliably the previous value $q^n$. The time during which the circuit must store its previous state dynamically on the capacitances of internal nodes is only the clock high time. The signal value is freshly restored each clock cycle. The circuit is fully static when the clock is low. Charge sharing between the nodes in the circuit 10 and nodes in the switching function networks $SF_a$ and $SF_b$ is possible, as mentioned above. If the clock rise is gradual, the effects of charge stored in the switching function networks can be completely eliminated. As the clock rises, both pass transistors $Q_3$ and $Q_4$ turn on before the power-down transistor $Q_o$ turns off. Any stored charge reachable from the circuit nodes will be charged to the present state. Since the inputs come from stages clocked on the opposite phase, they are stable during the entire clock event. Hence any nodes not charged to the current stage will not affect the circuit nodes, since they cannot be reached. This line of argument constitutes a proof that, given enough time, the circuit state cannot be changed unless one of the switching functions is true. The state ($q^{n+1}$) of a stage after the clock event can be determined from the state ($q^n$) before the clock event according to the following table:

| $SF_a$ | $SF_b$ | $q^{n+1}$ |
|---|---|---|
| 0 | 0 | $q^n$ |
| 0 | 1 | 0 |
| 1 | 0 | 1 |
| 1 | 1 | ? |

It will be recognized that this table is characteristic of a set-reset (SR) flip-flop. Consequently, the circuit 10 is a static bistable circuit that has steering logic in its path and is monodirectional. Using two nonoverlapping phases ($\phi_1$ and $\phi_2$) and two lines ($L_1$ and $L_2$) assures no racing condition in reaching the appropriate stable state. The circuit works well with slow rise and fall times for the clock pulses, which is an advantage for VLSI circuits which will inherently have slow rise and fall times.

Figure 4:
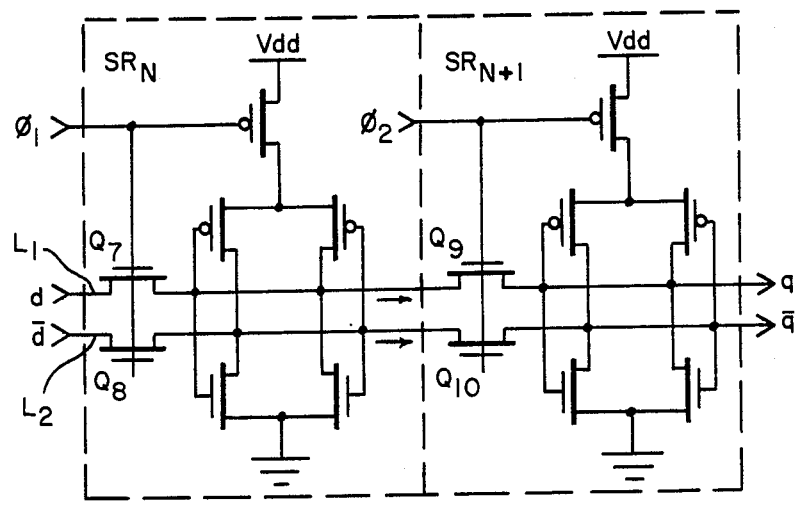
FIG. 4 illustrates a shift register stage implemented with two of the circuits of the general form shown in FIG. 1.

Operation of the SR circuit in a shift register is illustrated in FIG. 4 which shows two stages N and N+1. These stages may be preceded by switching functions or another stage N−1, and may be followed by switching functions or another stage N+2. Note that the data bit signals are on two lines $L_1$ and $L_2$; both a data bit d and its complement $\bar{d}$ are present for each clock phase at each stage.

As clock phase $\phi_2$ rises, the power supply to the stage N+1 is limited by its power-down transistor $Q_o$. By the time $\phi_2$ reaches the threshold of its two pass transistors $Q_3$ and $Q_4$, the current to the stage N+1 is limited to about half the maximum that can be supplied when the clock is low. For this reason, the preceding stage N, which is fully powered up, can force its state into stage N+1 as the clock phase $\phi_2$ rises. Similarly, the stage N+1 can transfer its contents into a following stage N+2 on the rising edge of a clock phase $\phi_1$. Monodirectionality of the transfer is guaranteed by the association of the power-down transistor $Q_o$ in the receiving stage with a rising two-phase clock signal, and the mutual nonoverlap of the clock phases $\phi_1$ and $\phi_2$.

Figure 5A:
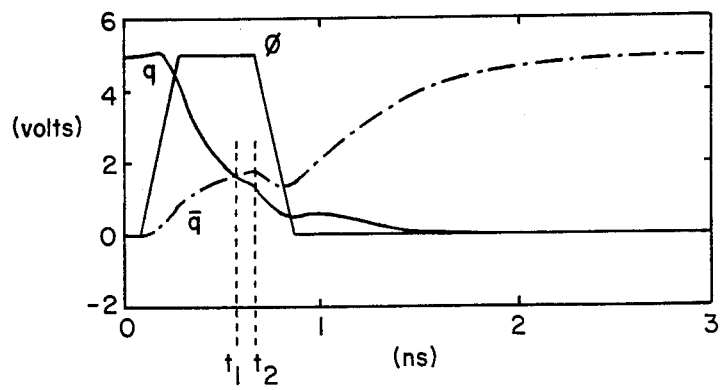
FIGS. 5a and 5b are timing diagrams useful in understanding the operation of the shift register stage shown in FIG. 4.
Figure 5B:
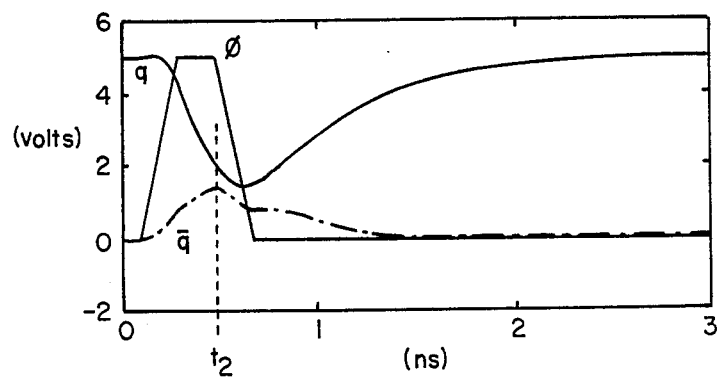

The dynamics of a transfer are shown in FIGS. 5a and 5b. The interesting case, illustrated in both figures, is when the new data is different than the previously stored data. During the $\phi_2$ period, the upper line $L_1$ discharges toward ground and the lower line $L_2$ charges toward $V_{dd}$. The rates are limited by the capacitances of the nodes and the resistances of the pass transistors $Q_3$ and $Q_4$. After a time $t_1$ the two voltages are equal. The phase $\phi_2$ returns to zero at time $t_2$. If $t_2 > t_1$, as shown in FIG. 5a, a successful transfer of a data bit from stage N into stage N+1 results. There is no need to wait for the two signal lines to pass any absolute threshold.

Each SR flip-flop stage can be viewed as a sense amplifier with very high differential gain. The sense-amplifier action will fully restore both the data bit and its complement as long as their relative values are of the correct sign when the clock falls.

FIG. 5b illustrates an attempted transfer in which the falling edge of the clock preceded the time $t_1$ at which the two signals become equal. Under these conditions the signals return to their previous values, and the transfer fails. The time $t_1$ thus represents the minimum time the clock must be high, and thereby limits the maximum frequency of operation. At least one clock is low at all times; consequently the shift register is fully static.

Figure 6:
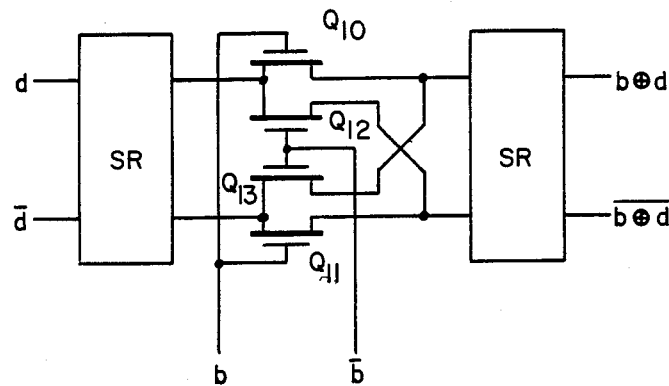
FIG. 6 illustrates an exclusive-NOR function implemented with two of the circuits of FIG. 1 and some logic devices.

There are a class of functions that can be implemented by merely routing one of several sources of data to a given stage. The most familiar example is the exclusive-NOR shown in FIG. 6. In this figure, a rectangle is used to represent an SR circuit implemented as shown in FIG. 1 or FIG. 2. Here the data bit d and its complement $\bar{d}$ are passed unchanged if the control signal b is a zero, or data is interchanged with its complement (from 1 to 0, or 0 to 1) if the control signal b is a one. The dynamics of transfer are identical to those shown in FIG. 5a, except for the lengthening of $t_1$ due to the higher resistance of the string of pass transistors which now include the exclusive-NOR function transistors $Q_{10}$–$Q_{14}$, their gate-channel capacitance, and the capacitance associated with their sources and drains. Once these capacitances exceed those associated with the SR circuits, the time $t_1$ increases as the square of the number of series elements.

Figure 7:
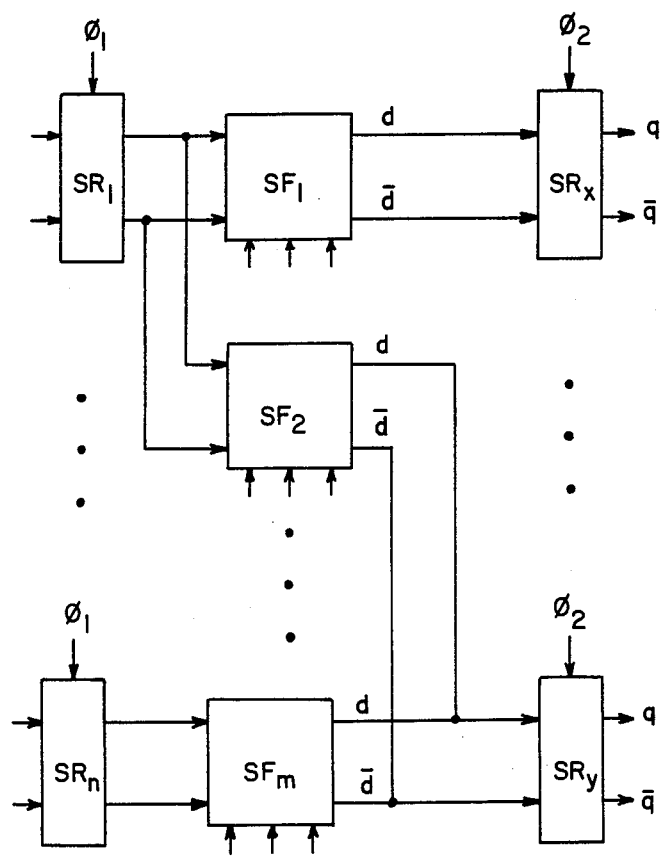
FIG. 7 illustrates a fan-in fan-out multiplexer function implemented with a plurality of the circuits of FIG. 1 and some mutually exclusive logic switching functions.

From the foregoing, it can be appreciated that the SR circuit shown in its general form in FIG. 1 may be used in a variety of ways besides receiving data through a general switching function, two of which have been illustrated, namely a shift register and an exclusive-NOR circuit. One other that will readily occur to those skilled in the art is a more general form of the multiplexer function illustrated by the special case of an exclusive-NOR, is routing one of several sources of data (SR circuits) $SR_1$ through $SR_n$ to a given SR circuit through distinct switching functions $SF_1$ through $SF_m$, as shown in FIG. 7, where m is a number that need not be the same as n, and usually will not be, and the two switching functions $SF_a$ and $SF_b$ associated with an SR circuit are considered together as a general switching function SF for the stage that follows. A plurality of circuits, $SR_x$ through $SR_y$, are clocked at phase $\phi_2$. Each has at least one switching function, and any particular SR circuit may have more than one switching function connected to its input as shown for the circuit $SR_y$, but the switching functions are mutually exclusive, i.e., only one of several connected to one SR circuit may be turned on at any given time. When a switching function to a given circuit such as $SR_y$ is on, both of its lines to the given SR circuit will be connected; all other switching functions will have their two lines disconnected. More than one SR circuit that may receive data from a given SR circuit through switching functions (fan-out), and one SR circuit may be designated to receive data from more than one SR circuit through switching functions (fan-in), but in the case of fan-in, the switching functions are mutually exclusive between sets of SR circuits.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. An integrated circuit comprised of two set-reset circuits, a first set-reset circuit and a second set-reset circuit, each comprised of two cMOS inverters connected in parallel to a source of power by at least one power-down MOS transistor of a type chosen from a group consisting of n-channel and p-channel MOS transistors, each of said cMOS inverters comprising a first MOS transistor of the same n- or p-channel type as said power-down transistor connected directly to said power-down transistor and a second MOS transistor of the n- or p-channel type not chosen for said power-down transistor connected in series with said first MOS transistor, an output terminal at a junction between the first and second series transistors, an input terminal connected to the gate of each of said first and second series transistors, and two signal-pass MOS transistors of the same type as said second MOS transistor of each MOS inverter, one signal-pass transistor connected as a series switch in a first signal line for receiving a data bit $SF_a$ connected to the input terminal of one cMOS inverter and the output terminal of the other cMOS inverter, and the other signal-pass transistor connected as a series switch in a second signal line for receiving a data bit $SF_b$ connected to the input terminal of the other cMOS inverter and the output terminal of the one cMOS inverter, whereby said two cMOS inverters are directly cross-coupled, input to output, and the input to each is gated by a separate one of said pass transistors, a source of first and second nonoverlapping phase clock signals, said first phase clock signals being connected to the gates of said power-down and signal-pass transistors of said first set-reset circuit, and said second phase clock signals being connected to the gates of said power-down and signal-pass transistors of said second set-reset circuit, Boolean logic means for independently producing said data bits $SF_a$ and $SF_b$, whereby monodirectional transfer of data bits $SF_a$ and $SF_b$ into said second set-reset circuit in response to one of said clock signals is effected according to the following table

| $SF_a$ | $SF_b$ | $q^{n+1}$ |
| --- | --- | --- |
| 0 | 0 | $q^n$ |
| 0 | 1 | 0 |
| 1 | 0 | 1 |
| 1 | 1 | x | where x indicates the new state $q^{n+1}$ is uncertain, wherein output terminals of said first set-reset circuit are coupled to pass transistors of said second set-reset circuit by two separate switching functions comprised of MOS transistors of the same type as said pass transistors, said MOS transistors of said switching functions having their gates connected to receive data bits, a separate one of said switching functions being connected to each pass transistor to provide current paths between circuit ground and said pass transistors under control of data signals, and wherein at least one of said switching functions is comprised of at least three transistors, one transistor connected in series with a second transistor, and a third transistor connected in parallel with one of said transistors to provide a series-parallel network of transistors between circuit ground and said pass transistors.

2. An integrated circuit as defined in claim 1 wherein the other one of said switching functions consists of three transistors connected in series, each receiving a different one of said three distinct data signals a, b and m, and wherein parallel transistors of said one of said switching functions each receive a different one of two distinct data signals $\overline{m}$ and $\overline{b}$ and the third transistor connected in series with the paralleled transistors receives a distinct signal $\overline{a}$, where $\overline{a}$, $\overline{b}$ and $\overline{m}$ are the complements of said signals a, b and m, thereby computing the carry bit in a system for computing $a+(b \times m)$.

3. An integrated circuit comprised of two set-reset circuits, a first set-reset circuit and a second set-reset circuit, each comprised of two cMOS inverters connected in parallel to a source of power by at least one power-down MOS transistor of a type chosen from a group consisting of n-channel and p-channel MOS transistors, each of said cMOS inverters comprising a first MOS transistor of the same n- or p-channel type as said power-down transistor connected directly to said power-down transistor and a second MOS transistor of the n- or p-channel type not chosen for said power-down transistor connected in series with said first MOS transistor, an output terminal at a junction between the first and second series transistors, an input terminal connected to the gate of each of said first and second series transistors, and two signal-pass MOS transistors of the same type as said second MOS transistor of each MOS inverter, one signal-pass transistor connected as a series switch in a first signal line for receiving of a data bit $SF_a$ connected to the input terminal of one cMOS inverter and the output terminal of the other cMOS inverter, and the other signal-pass transistor connected as a series switch in a second signal line for receiving of a data bit $SF_b$ connected to the input terminal of the other cMOS inverter and the output terminal of the one cMOS inverter, whereby said two cMOS inverters are directly cross-coupled, input to output, and the input to each is gated by a separate one of said pass transistors, a source of first and second nonoverlapping phase clock signals, said first phase clock signals being connected to the gates of said power-down and signal-pass transistors of said first set-reset circuit, and said second phase clock signals being connected to the gates of said power-down and signal-pass transistors of said second set-reset circuit, Boolean logic means for independently producing said data bits $SF_a$ and $SF_b$, whereby monodirectional transfer of data bits $SF_a$ and $SF_b$ into said second set-reset circuit in response to one of said clock signals is effected according to the following table

| $SF_a$ | $SF_b$ | $q^{n+1}$ |
| --- | --- | --- |
| 0 | 0 | $q^n$ |
| 0 | 1 | 0 |
| 1 | 0 | 1 |
| 1 | 1 | x | where x indicates the new state $q^{n+1}$ is uncertain, wherein output terminals of said first set-reset circuit are coupled to pass transistors of said second set-reset circuit by two separate switching functions comprised of MOS transistors of the same type as said pass transistors, said MOS transistors of said switching functions having their gates connected to receive data bits, a separate one of said switching functions being connected to each pass transistor to provide current paths between circuit ground and said pass transistors under control of data signals b and m, and wherein one of said switching functions is comprised of two transistors connected in series, each to receive a separate one of said signals b and m, and the other of said switching functions is comprised of two transistors in parallel each connected to receive a separate one of said signals b and m complemented.

4. An integrated circuit comprised of two set-reset circuits, a first set-reset circuit and a second set-reset circuit, each comprised of two cMOS inverters connected in parallel to a source of power by at least one power-down MOS transistor of a type chosen from a group consisting of n-channel and p-channel MOS transistors, each of said cMOS inverters comprising a first MOS transistor of the same n- or p-channel type as said power-down transistor connected directly to said power-down transistor and a second MOS transistor of the n- or p-channel type not chosen for said power-down transistor connected in series with said first MOS transistor, an output terminal at a junction between the first and second series transistors, an input terminal connected to the gate of each of said first and second series transistors, and two signal-pass MOS transistors of the same type as said second MOS transistor of each MOS inverter, one signal-pass transistor connected as a series switch in a first signal line for receiving of a data bit $SF_a$ connected to the input terminal of one cMOS inverter and the output terminal of the other cMOS inverter, and the other signal-pass transistor connected as a series switch in a second signal line for receiving of a data bit $SF_b$ connected to the input terminal of the other cMOS inverter and the output terminal of the one cMOS inverter, whereby said two cMOS inverters are directly cross-coupled, input to output, and the input to each is gated by a separate one of said pass transistors, a source of first and second nonoverlapping phase clock signals, said first phase clock signals being connected to the gates of said power-down and signal-pass transistors of said first set-reset circuit, and said second phase clock signals being connected to the gates of said power-down and signal-pass transistors of said second set-reset circuit, Boolean logic means for independently producing said data bits $SF_a$ and $SF_b$, whereby monodirectional transfer of data bits $SF_a$ and $SF_b$ into said second set-reset circuit in response to one of said clock signals is effected according to the following table

| $SF_a$ | $SF_b$ | $q^{n+1}$ |
|---|---|---|
| 0 | 0 | $q^n$ |
| 0 | 1 | 0 |
| 1 | 0 | 1 |
| 1 | 1 | x | where x indicates the new state $q^{n+1}$ is uncertain, wherein output terminals of said first set-reset circuit are coupled to pass transistors of said second set-reset circuit by two separate switching functions comprised of MOS transistors of the same type as said pass transistors, said MOS transistors of said switching functions having their gates connected to receive data bits a separate one of said switching functions being connected to each pass transistor to provide current paths between circuit ground and said pass transistors under control of data signals, and wherein one of said switching functions is comprised of two transistors, one transistor connected to receive a signal a in series with a second transistor connected to receive a signal b, and the other switching function is identical to said one switching function, but connected to receive the signals a and b complemented.

5. An integrated circuit comprised of two set-reset circuits, a first set-reset circuit and a second set-reset circuit, each comprised of two cMOS inverters connected in parallel to a source of power by at least one power-down MOS transistor of a type chosen from a group consisting of n-channel and p-channel MOS transistors, each of said cMOS inverters comprising a first MOS transistor of the same n- or p-channel type as said power-down transistor connected directly to said power-down transistor and a second MOS transistor of the n- or p-channel type not chosen for said power-down transistor connected in series with said first MOS transistor, an output terminal at a junction between the first and second series transistors, an input terminal connected to the gate of each of said first and second series transistors, and two signal-pass MOS transistors of the same type as said second MOS transistor of each MOS inverter, one signal-pass transistor connected as a series switch in a first signal line for receiving of a data bit $SF_a$ connected to the input terminal of one cMOS inverter and the output terminal of the other cMOS inverter, and the other signal-pass transistor connected as a series switch in a second signal line for receiving of a data bit $SF_b$ connected to the input terminal of the other cMOS inverter and the output terminal of the one cMOS inverter, whereby said two cMOS inverters are directly cross-coupled, input to output, and the input to each is gated by a separate one of said pass transistors, a source of first and second nonoverlapping phase clock signals, said first phase clock signals being connected to the gates of said power-down and signal-pass transistors of said first set-reset circuit, and said second phase clock signals being connected to the gates of said power-down and signal-pass transistors of said second set-reset circuit, Boolean logic means for independently producing said data bits $SF_a$ and $SF_b$ from data bits received from signal sources, whereby monodirectional transfer of data bits $SF_a$ and $SF_b$ into said second set-reset circuit in response to one of said clock signal is effected according to the following table

| $SF_a$ | $SF_b$ | $q^{n+1}$ |
|---|---|---|
| 0 | 0 | $q^n$ |
| 0 | 1 | 0 |
| 1 | 0 | 1 |
| 1 | 1 | x | where x indicates the new state $q^{n+1}$ is uncertain, wherein output terminals of said first set-reset circuit are coupled to pass transistors of said second set-reset circuit by two separate switching functions comprised of MOS transistors of the same type as said pass transistors, said MOS transistors of said switching functions having their gates connected to receive data bits, a separate one of said switching functions being connected to each pass transistor to provide current paths between said data signal sources and said pass transistors under control of data signals, and wherein one of said switching functions is comprised of two transistors, one transistor connected to pass a signal d in response to a signal b, and a second transistor connected to pass the complement of said signal d in response to said signal b complemented, and the other one of said switching functions is comprised of two transistors, one transistor connected to pass said signal d complemented in response to said signal b and a second transistor connected to pass said signal d in response to said signal b complemented to provide an Exclusive OR function of signals b and d.

6. An integrated circuit comprised of two set-reset circuits, a first set-reset circuit and a second set-reset circuit, each comprised of two cMOS inverters connected in parallel to a source of power by at least one power-down MOS transistor of a type chosen from a group consisting of n-channel and p-channel MOS transistors, each of said cMOS inverters comprising

- a first MOS transistor of the same n- or p-channel type as said power-down transistor connected directly to said power-down transistor and a second MOS transistor of the n- or p-channel type not chosen for said power-down transistor connected in series with said first MOS transistor, an output terminal at a junction between the first and second series transistors, an input terminal connected to the gate of each of said first and second series transistors, and
- two signal-pass MOS transistors of the same type as said second MOS transistor of each MOS inverter, one signal-pass transistor connected as a series switch in a first signal line for receiving a data bit $SF_a$ connected to the input terminal of one cMOS inverter and the output terminal of the other cMOS inverter, and the other signal-pass transistor connected as a series switch in a second signal line for receiving a data bit $SF_b$ connected to the input terminal of the other cMOS inverter and the output terminal of the one cMOS inverter, whereby said two cMOS inverters are directly cross-coupled, input to output, and the input to each is gated by a separate one of said pass transistors,
- a source of first and second nonoverlapping phase clock signals, said first phase clock signals being connected to the gates of said power-down and signal-pass transistors of said first set-reset circuit, and said second phase clock signals being connected to the gates of said power-down and signal-pass transistors of said second set-reset circuit,
- Boolean logic means for independently producing said data bits $SF_a$ and $SF_b$, whereby monodirectional transfer of data bits $SF_a$ and $SF_b$ into said second set-reset circuit in response to one of said clock signals is effected according to the following table

| $SF_a$ | $SF_b$ | $q^{n+1}$ |
|---|---|---|
| 0 | 0 | $q^n$ |
| 0 | 1 | 0 |
| 1 | 0 | 1 |
| 1 | 1 | x | where x indicates the new state $q^{n+1}$ is uncertain, wherein output terminals of said first set-reset circuit are coupled to pass transistors of said second set-reset circuit by two separate and independent switching functions comprised of MOS transistors of the same type as said pass transistors, said MOS transistors of said switching functions having their gates connected to receive data bits, a separate one of said switching functions being connected to each pass transistor to provide current paths between circuit ground and said pass transistors under control of data signals, and wherein each of said separate switching functions is comprised of at least two transistors, one transistor connected in series with a second transistor, or in parallel with a second transistor between circuit ground and said pass transistors to provide a Boolean logic function a.b or a+b.

7. An integrated circuit as defined in claim 6 wherein said first set-reset circuit is one of a plurality of set-reset circuits in a first group of said reset circuits functioning as data signal sources, and said second set-reset circuit is one of a plurality of set-reset circuits in a second group of set-reset circuits functioning as data receivers, and a plurality of switching function means, each for coupling at least one set-reset circuit of said first group of set-reset circuits to at least two set-reset circuits of said second group of set-reset circuits and a plurality of switching means for coupling at least one of said second set-reset circuits to at least two of said set-reset circuits of said first group, each of said switching function means and said mutually exclusive switching function means is comprised of said two separate and independent switching functions.

* * * * *